United States Patent
Horng et al.

(10) Patent No.: US 12,087,389 B2
(45) Date of Patent: *Sep. 10, 2024

(54) DEVICE AND METHOD FOR READING DATA IN MEMORY

(71) Applicant: Taiwan Semiconductor Manufacturing Company, Ltd., Hsinchu (TW)

(72) Inventors: Jaw-Juinn Horng, Hsinchu (TW); Chin-Ho Chang, Hsinchu (TW); Yung-Chow Peng, Hsinchu (TW); Szu-Chun Tsao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/874,534

(22) Filed: Jul. 27, 2022

(65) Prior Publication Data

US 2022/0366948 A1 Nov. 17, 2022

Related U.S. Application Data

(63) Continuation of application No. 17/185,145, filed on Feb. 25, 2021, now Pat. No. 11,430,491.

(Continued)

(51) Int. Cl.
*G11C 7/10* (2006.01)
*G06F 7/544* (2006.01)
(Continued)

(52) U.S. Cl.
CPC .......... *G11C 7/1057* (2013.01); *G06F 7/5443* (2013.01); *G11C 7/062* (2013.01); *G11C 7/1084* (2013.01); *H03M 1/462* (2013.01)

(58) Field of Classification Search
CPC ..... G11C 7/1057; G11C 7/062; G11C 7/1084; G11C 7/1006; G11C 11/54;
(Continued)

(56) References Cited

U.S. PATENT DOCUMENTS 6,473,340 B1 10/2002 Pasotti et al.
2007/0081389 A1 4/2007 Tran et al.
(Continued)

FOREIGN PATENT DOCUMENTS

TW I266325 B 11/2006

*Primary Examiner* — Ajay Ojha
(74) *Attorney, Agent, or Firm* — Merchant & Gould P.C.

(57) ABSTRACT

In a compute-in-memory ("CIM") system, current signals, indicative of the result of a multiply-and-accumulate operation, from a CIM memory circuit are computed by comparing them with reference currents, which are generated by a current digital-to-analog converter ("DAC") circuit. The memory circuit can include non-volatile memory ("NVM") elements, which can be multi-level or two-level NVM elements. The characteristic sizes of the memory elements can be binary weighted to correspond to the respective place values in a multi-bit weight and/or a multi-bit input signal. Alternatively, NVM elements of equal size can be used to drive transistors of binary weighted sizes. The current comparison operation can be carried out at higher speeds than voltage computation. In some embodiments, simple clock-gated switches are used to produce even currents in the current summing branches. The clock-gated switches also serve to limit the time the cell currents are on, thereby reducing static power consumption.

20 Claims, 15 Drawing Sheets

Related U.S. Application Data

(60) Provisional application No. 63/018,101, filed on Apr. 30, 2020.

(51) Int. Cl.
*G11C 7/06* (2006.01)
*H03M 1/46* (2006.01)

(58) Field of Classification Search
CPC .............. G11C 2013/0045; G11C 7/08; G11C 2207/063; G06F 7/5443; G06F 2207/4814; H03M 1/462; H03M 1/742
See application file for complete search history.

(56) References Cited

U.S. PATENT DOCUMENTS

| | | |
|---|---|---|
| 2008/0205158 A1 | 8/2008 | Pagano et al. |
| 2009/0016132 A1 | 1/2009 | Hirano |
| 2010/0103751 A1 | 4/2010 | Van Acht et al. |
| 2015/0243352 A1 | 8/2015 | Park |
| 2016/0254060 A1 | 9/2016 | Pi et al. |
| 2019/0222221 A1* | 7/2019 | Tanabe .................... H03M 1/68 |
| 2019/0237142 A1 | 8/2019 | Tran et al. |

* cited by examiner

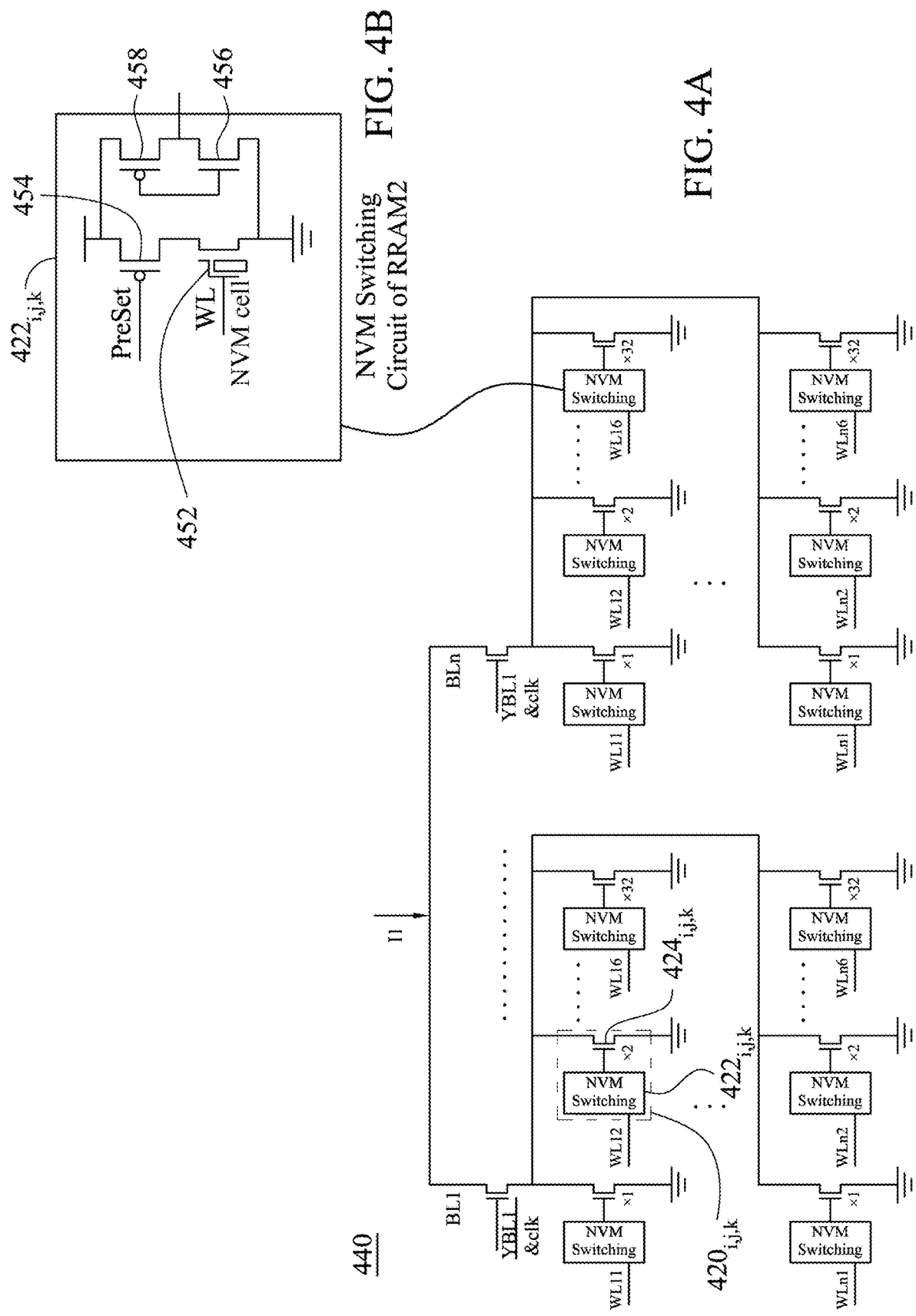

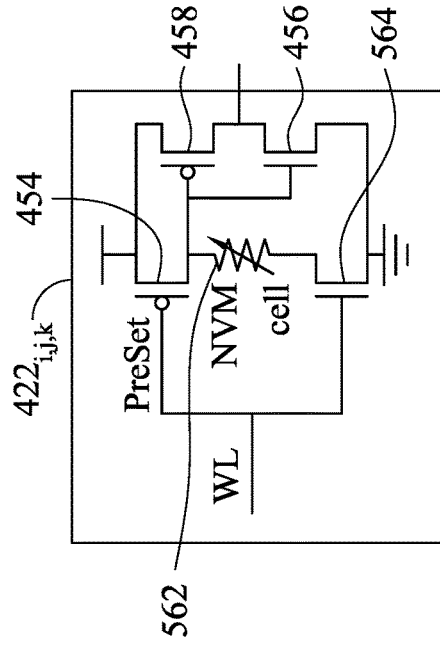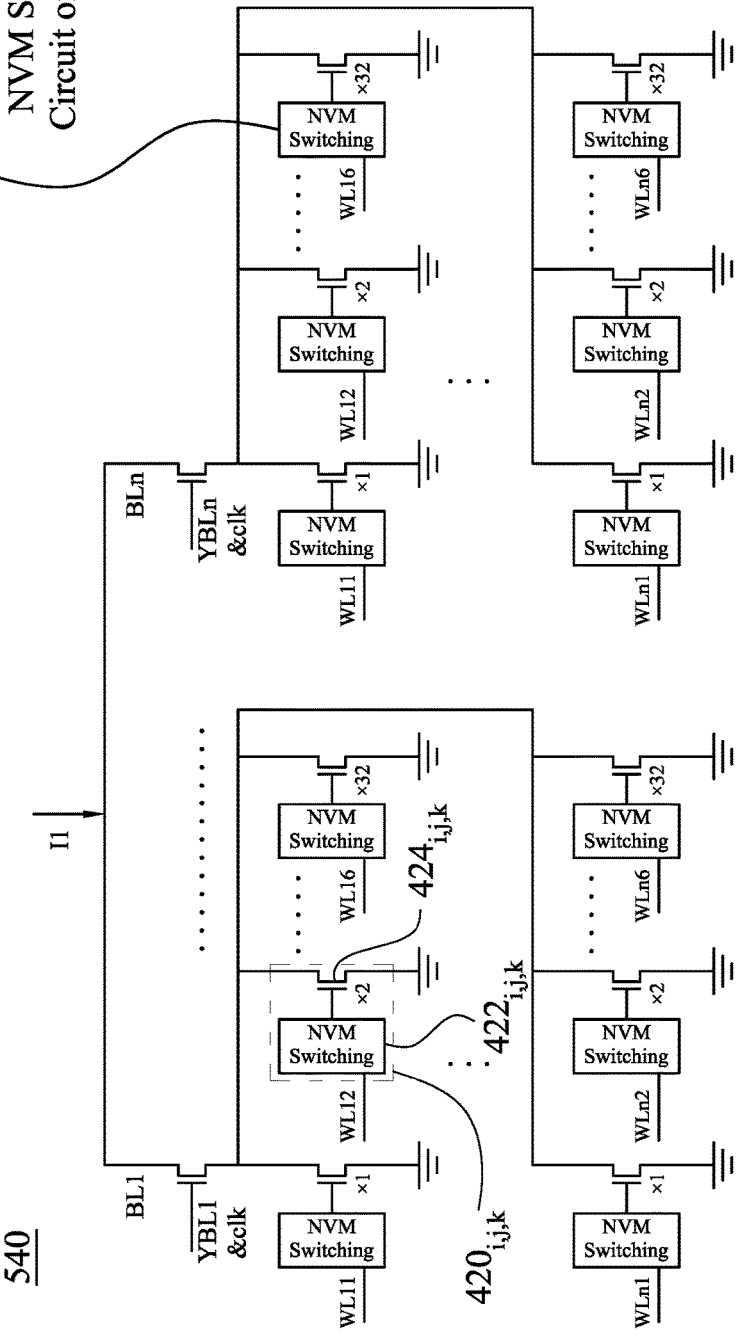

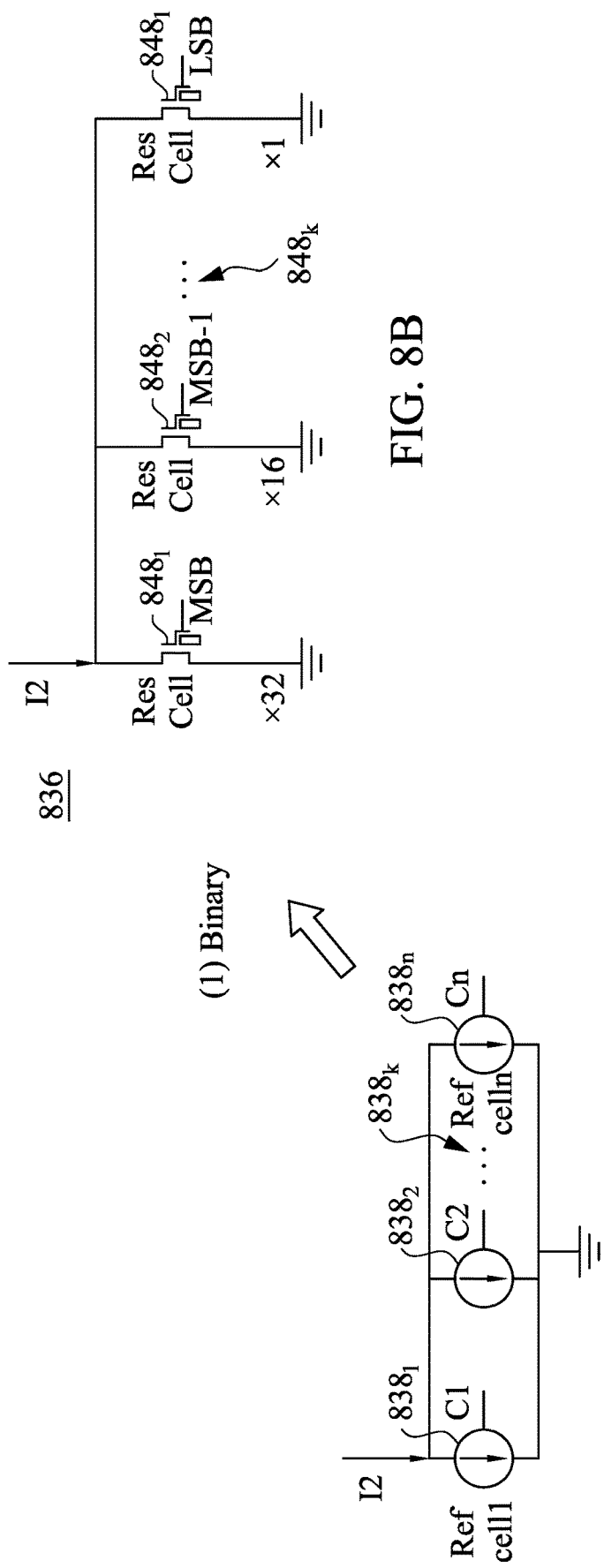
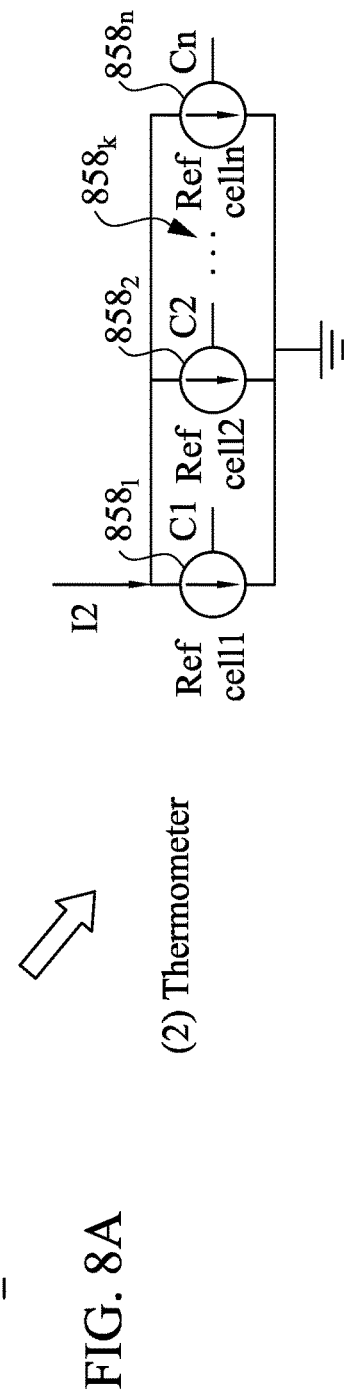
FIG. 8B
FIG. 8C
FIG. 8A
(1) Binary
(2) Thermometer

DEVICE AND METHOD FOR READING DATA IN MEMORY

CROSS-REFERENCE TO RELATED APPLICATIONS

The present application is a continuation of U.S. patent application Ser. No. 17/185,145, filed Feb. 25, 2021, now U.S. Pat. No. 11,430,491, which claims the benefit of U.S. Provisional Patent Application No. 63/018,101 titled "COMPUTING-IN-MEMORY ARCHITECTURE USING NON-VOLATILE MEMORY IN HIGH SPEED (GHZ) OPERATION" and filed Apr. 30, 2020, the disclosures of which are hereby incorporated by reference in their entirety.

BACKGROUND

This disclosure relates generally to compute-in-memory ("CIM"), or in-memory computing, systems. CIM systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications. Efforts are ongoing to improve the performance of compute-in-memory systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B show a memory circuit in the memory system shown in FIG. 1, in accordance with some embodiments.

FIGS. 5A and 5B show a memory circuit in the memory system shown in FIG. 1, in accordance with some embodiments.

FIG. 8A shows a current DAC circuit in the memory system shown in FIG. 7, in accordance with some embodiments.

FIGS. 8B and 8C show more detailed implementations of the current DAC circuit of FIG. 8A, in accordance with some embodiments.

DETAILED DESCRIPTION

Figure 1:
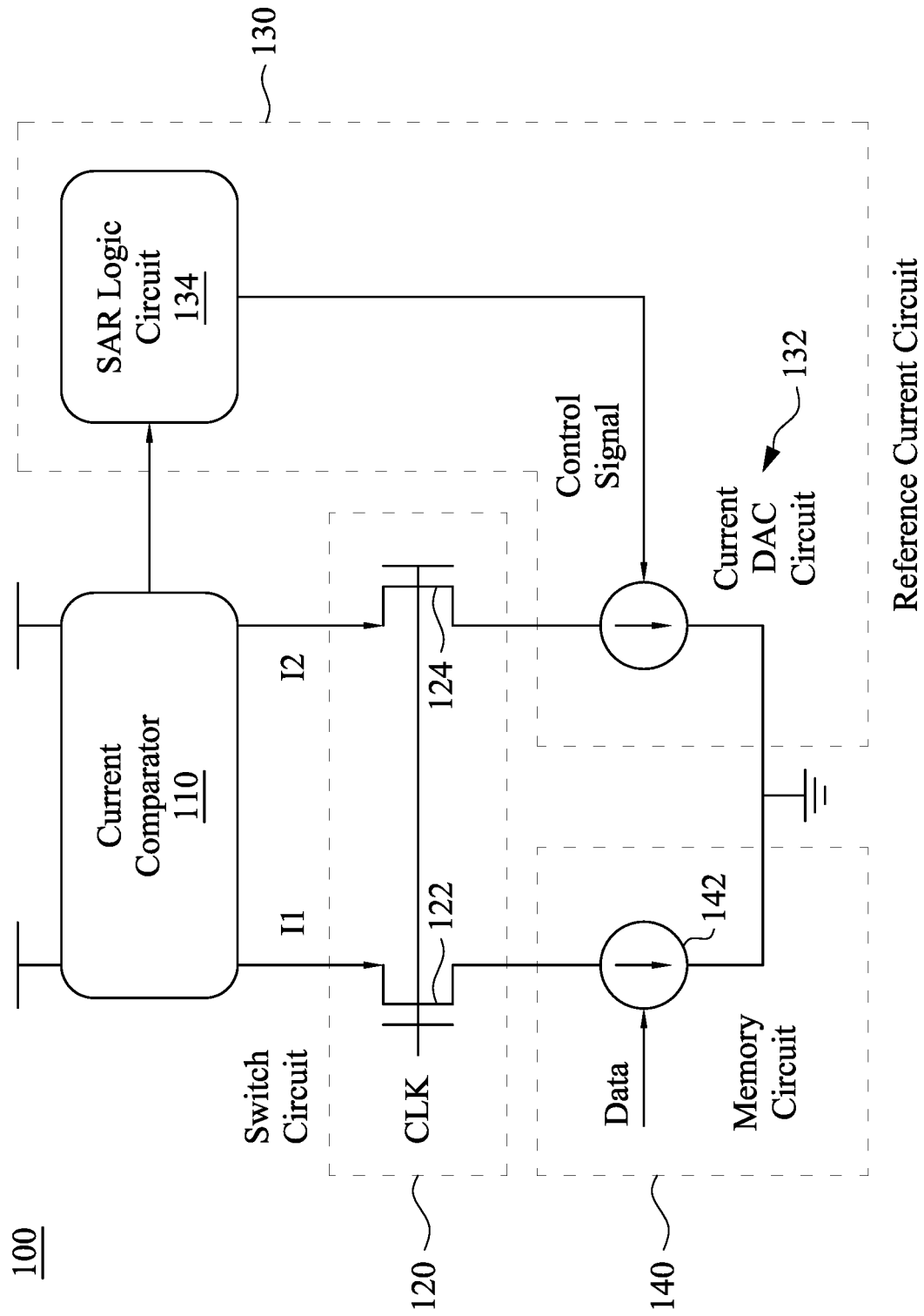
FIG. 1 is a block diagram illustrating an example of a memory system having a memory circuit and a subsystem for reading data stored in the memory circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Specific examples shown in this disclosure relate to computing-in-memory ("CIM"). An example of applications of computing-in-memory is multiply-accumulate operations, in which an input array of numbers are multiplied (weighted) by the respective elements in another array (e.g., column) of numbers (weights), and the products are added together (accumulated) to produce an output sum. This procedure is mathematically similar to a dot product (or scalar product) procedure, in which the components of two vectors are pair-wise multiplied with each other, and the products of the component pairs are summed. In certain artificial intelligence (AI) systems, such as artificial neural networks, an array of numbers can be weighted by multiple columns of weights. The weighting by each column produces a respective output sum. An output array of sums thus is produced from an input array of numbers by the weights in a matrix of multiple columns.

Memory devices of various types can be used to perform CIM tasks. For example, static random-access memory ("SRAM") cells; non-volatile memory ("NVM") cells such as eFlash cells, resistive random-access memory ("RRAM") cells and ferroelectric field-effect transistors ("FeFETs") can be used.

Conventional CIM circuits typically use operational amplifiers ("OP-amps") for computing voltage signals that result from integrating currents in memory cells. Such circuits are not suitable for operations at high speeds without using large static currents. Large static current signals require high power consumption. In addition, clamping circuit for each memory cell in CIM circuits is often employed to ensure that the cell current for each memory cell is even. Such clamping circuits further increase the manufacturing cost of the CIM circuits.

In accordance with some aspects of the present disclosure, instead of voltage signals, current signals from a CIM memory circuit are computed by comparing them with reference currents, which are generated by a current digital-to-analog converter ("DAC") circuit. The current comparison operation can be carried out at higher speeds than voltage computation. In some embodiments, simple clock-gated switches are used to produce even currents in the current summing branches. The clock-gated switches also serve to limit the time the cell currents are on, thereby reducing static power consumption.

In some embodiments, a current comparator is used to compare the memory current through the memory circuit and the reference current through the current DAC circuit and generates an output signal indicative of the difference between the two currents. A logic circuit, such as a successive-approximation register ("SAR") logic circuit (e.g., an SAR analog-to-digital converter ("ADC")) receives the output signal and generates a corresponding digital signal. The current DAC circuit adjusts the reference current based on the digital signal, and the reference current at which the difference between the two currents is less than a certain value is taken as representative of the memory current.

Referring to FIG. 1, in some embodiments, a computing system 100 includes a memory circuit 140, which includes a memory current generator 142, which stores weights (i.e., weight values) and is adapted to receive input data and generates a memory current, I1, indicative of some function of the input data and the stored weights. For example, the memory current in some embodiments is the sum of the product of the input data and respective stored weights. The system 100 also includes a reference current circuit 130, which includes an SAR logic circuit 134 (e.g., an SAR analog-to-digital converter ("ADC")) and a current DAC circuit 132, which is adapted to generate a reference current, I2, in response to a digital control signal from the SAR logic circuit 134. The memory circuit 142 and current DAC circuit 132 are connected to the source sides of transistors 122 and 124, respectively, of a switch circuit 120. The drain sides of the transistors 122 and 124 are connected to a current comparator 110. The transistors 122 and 124 are gated by a clock signal, CLK, and the voltages on the drain sides of the transistors 122 and 124 depends on I1 and I2, respectively, through the memory circuit 142 and current DAC circuit 132. Although the memory circuit 142 is shown in FIG. 1 as being connected to the current comparator 110 via a single transistor 122, in memory circuits in having multiple branches (columns) of memory cells, as shown in further embodiments below, multiple transistors 122 can be included, one for each branch. The current comparator 110 generates an output signal indicative of the difference between the currents I1 and I2. The output signal is fed to the SAR logic circuit 134, which generates the digital control signal used by the current DAC circuit 132.

Figure 2:
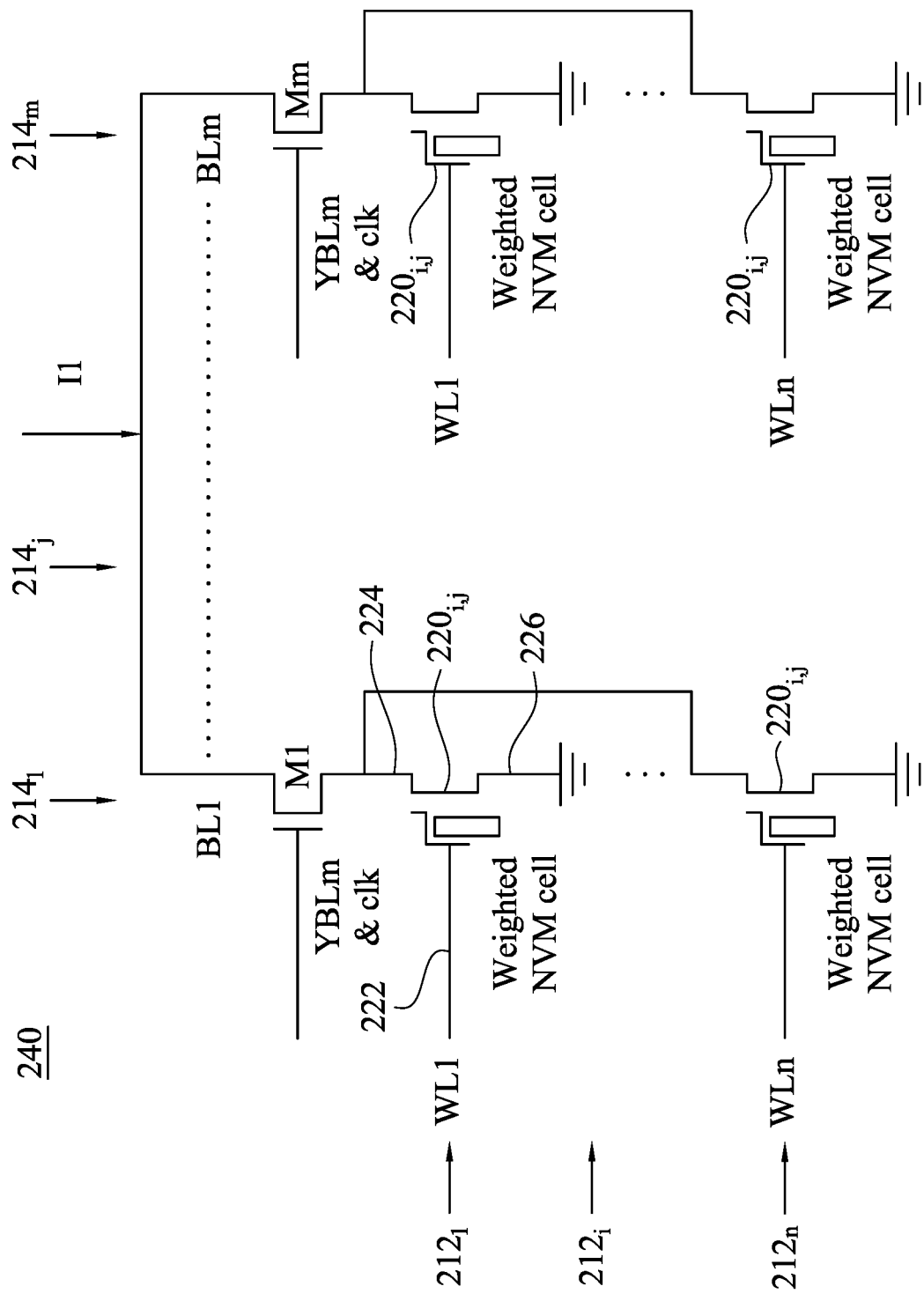
FIG. 2 is a schematic diagram of a memory circuit in the memory system shown in FIG. 1, in accordance with some embodiments.

In some embodiments, a memory circuit 140 includes at least on column of memory cells and is capable of performing multi-bit multiply-and-accumulate ("MAC") operations. FIG. 2 shows an implementation 240 of the memory circuit 140 that includes branches (columns) 214 (each column indexed as the jth column) of memory elements 220 (each indexed i,j, as being in the ith row $212_i$ and jth column $214_j$). Each of the m columns 214 includes a clock-gated transistor M1, M2, . . . , Mm, which can be alternately turned on and off so that the current of each column, or bitline ("BL") can be compared with the reference current. Each column 214 is capable of performing MAC operations in which the input is a binary number, and the stored weight is a number of up to the number of available storage states.

Each memory element 220 in this example embodiment is a non-volatile memory ("NVM") element, such as an eFlash, RRAM, FeFET, magnetoresistive RAM ("MRAM") or non-volatile SRAM memory cell. In the example shown in FIG. 2, each memory element 220 is a three-terminal NVM cell having a control terminal 222 (e.g., gate) and two current carrying terminals 224,226 (e.g., drain and source in an FeFET). The data stored in each memory element 220 is represented for example by the resistance between the current carrying terminals 224,226. In some embodiments, each memory element 220 is a multi-level memory element, i.e., capable of having more than two storage states, such as current or resistance levels. Each bit of the input signal is applied to the control input 222 (also referred to as wordline ("WL")) of each memory element 220 to turn the memory element ON or OFF. For example, if the input on WL1 is 1, the memory element $220_{1,1}$ is ON and thus conducts a current whose level is determined by the resistance level, or memory state, of the memory element $220_{1,1}$; if the input on WL1 is 0, the memory element $220_{1,1}$ is OFF and thus conducts no current or a current below a threshold level for any non-zero stored value. Thus, the current through each memory cell 220 is indicative of (e.g., proportional to) the product of the (multi-bit) value, $W_j$, stored in the cell and the value (0 or 1), $B_{WL(i,j)}$, of the bit present on the WL of the cell.

The memory elements 220 in each column $214_j$ are connected in parallel between the source of the clock-gated transistor M(j) (e.g., M1) for that column and a reference voltage, such as ground. Thus, the current through M(j) is indicative of (e.g., proportional to) the sum of products of the (multi-bit) values, $W_j$, stored in the cell and the values (0 or 1), $B_{WL(i,j)}$, of the bit present on the respective WLs of the memory cells in the column.

Each memory element 220 has a characteristic size, defined as the "W/L ratio," which is a geometric factor relating to the gate width and length. The size of a memory element determines the magnitude of the current for a given gate bias. In some embodiments, the characteristic sizes of the memory elements 220 in the same column are binary weighted, i.e., according to the position values of the respective WL. For example, in some embodiments, the size of a memory element for WL(i) can be proportional to $2^{i-1}$, i=1, 2, . . . , n. In such an example, if the size of the memory element $200_{1,j}$ is a, then the size of $200_{2,j}$ is 2a, the size of $200_{3,j}$ is 4a, . . . and the size of $200_{n,j}$ is $2^{n-1}$a. Thus, in some embodiments, the current in each memory cell is proportional to $2^{i-1} \cdot B_{WL(i,j)} \cdot W_j$. The total current in the jth column, BL(j), is the sum of the currents through all memory cells in the column and thus proportional to $\Sigma_i 2^{i-1} \cdot B_{WL(i,j)} \cdot W_j$. This is the product of an n-bit input $(B_n B_{n-1} \ldots B_2 B_1)_j$ and a multi-bit weight $W_j$ for column $214_j$.

The clock-gated transistors M1, M2, ..., Mm can be turned on one at a time in some embodiments. In such cases, I1 is the current of the column $214_j$ whose transistor M(j) is turned on. In other embodiments, multiple, or all, clock-gated transistors M1, M2, ..., Mm can be turned on simultaneously. In that case, I1 is proportional to the sum of the products of multi-bit input and respective multi-bit weights. A multi-bit multiply-and-accumulate ("MAC") operation is thus implements by the memory circuit 240.

Figure 3:
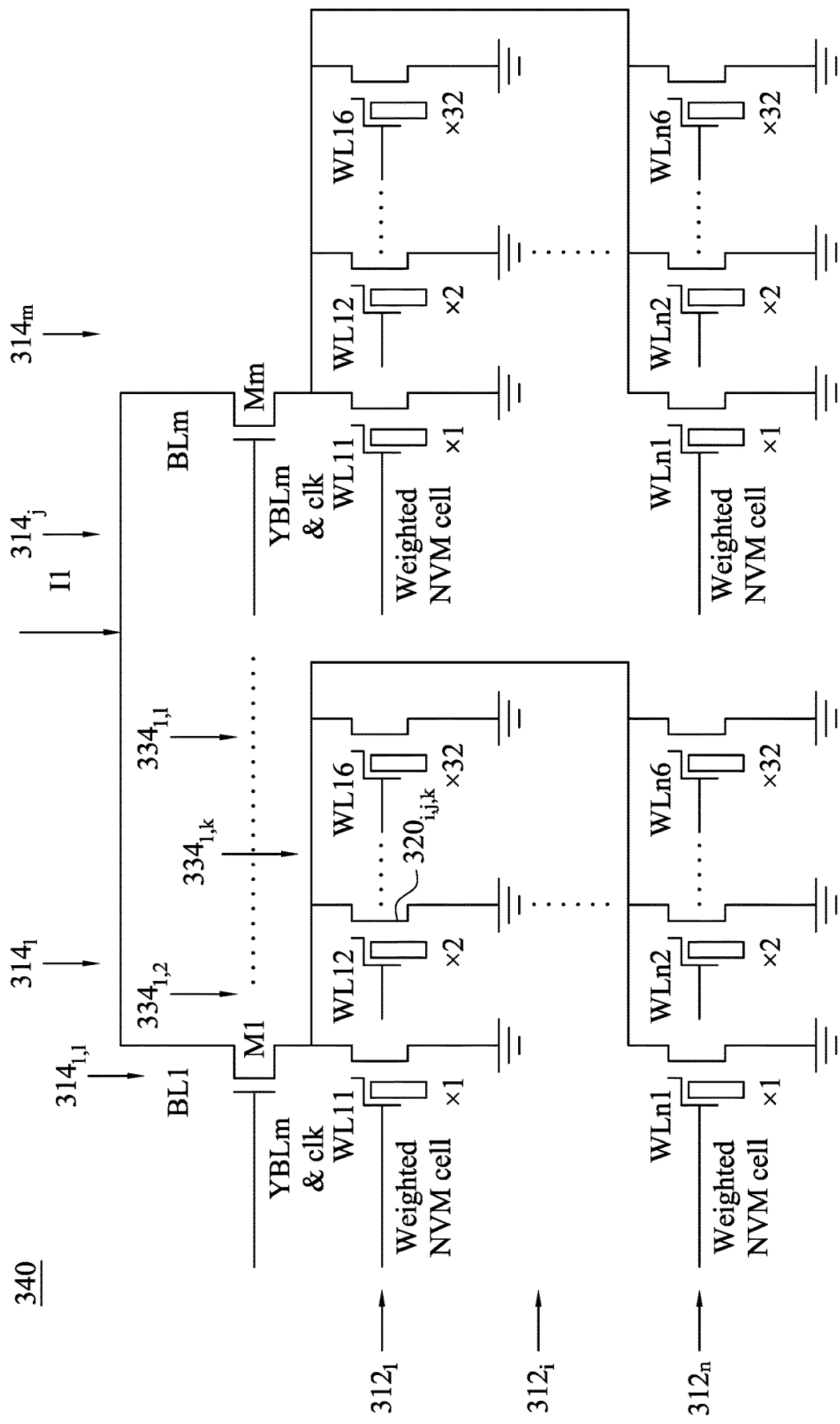
FIG. 3 is a schematic diagram of a memory circuit in the memory system shown in FIG. 1, in accordance with some embodiments.

In some embodiments, such as the example shown in FIG. 3, the memory circuit 140 in FIG. 1 can be implemented by the memory circuit 340, which is similar to the memory circuit 240 in FIG. 2 but with each multi-level NVM 220 replaced by a set of binary NVMs $320_{i,j,k}$, where i denotes the ith row $312_i$, j the jth bitline $314_j$, BL(j), and k the kth bit of the weight. In this example k=1, 2, ..., 6, but can be any integer, depending on the precision of the weight used.

In some embodiments, such as the example in FIG. 3, the size of each NVM element 320 is weighted, not only by the position value of the multi-bit input, as in the example shown in FIG. 2, but also by the position value of bit, $B_W$, in the multi-bit weight. That is, $2^{i-1} \cdot B_{WL(i,j)} \cdot 2^{k-1} \cdot B_{W(k)} \cdot W_j$. In the example shown here, within each row $312_i$, the relative sizes among the six memory elements are 1, 2, 4, 8, 16 and 32, respectively. Then, the sum of the currents in each row within each BL is the product of a bit in the input and the multi-bit weight, and the total current in each BL is again the product of a multi-bit input and a multi-bit weight. Like for the example circuit 240 shown in FIG. 2, if multiple, or all of, the clock-gated transistors M1, M2, ..., Mm, are turned on simultaneously, I1 is proportional to the sum of the products of multi-bit input and respective multi-bit weights. A multi-bit multiply-and-accumulate ("MAC") operation is thus implements by the memory circuit 340.

In some embodiment, such as the example shown in FIGS. 4A and 4B, the memory circuit 440 is similar to the circuit 340 described above and shown in FIG. 3, except that each NVM cell 320 is replaced by an RRAM circuit 420, which in this example includes an NVM switching circuit 422 and a weighted transistor 424, i.e., a transistor the size of which is binary weighted, in this case by both the position values in the multi-bit input and multi-bit weight as discussed above in relation to FIG. 3. The NVM switching circuit 422 includes a RRAM transistor 452 for storing the data (in this case binary (two-level)). The RRAM transistor 452 is controlled by the signal WL to output the data when signal is enabled. The NVM switching circuit 422 further includes a preset transistor 454 for initializing the RRAM transistor 452, and includes a CMOS inverter that includes transistors 456 and 458 for driving the weighted transistor 424.

In other embodiments, such as the example shown in FIGS. 5A and 5B, the memory circuit 540 is similar to the circuit 440 described above and shown in FIGS. 4A and 4B, except that the RRAM transistor 452 is replaced by a two-terminal NVM element 562 in series with a switching transistor 564. The switching transistor 564 is controlled by the signal WL to enable the NVM element 562 to when signal is enabled, output the data, which is manifested as a current generated by the weighted transistor 424 (driven by transistors 456 and 458) as a part of the total current in the respective $BL_1$, $BL_2$, or $BL_m$ (see, also, FIGS. 2, 3 and 4).

Figure 6B:
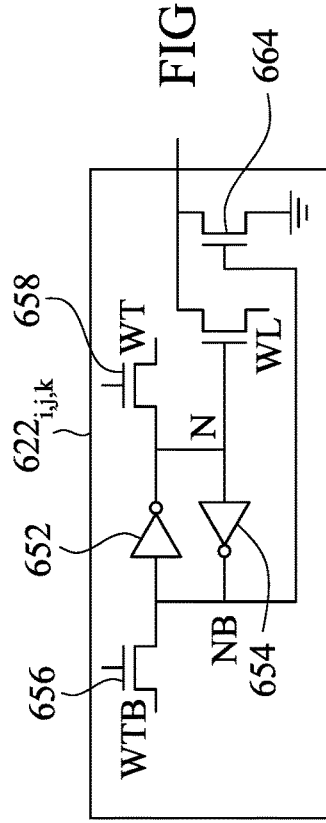
FIGS. 6A and 6B show a memory circuit in the memory system shown in FIG. 1, in accordance with some embodiments.
Figure 6A:
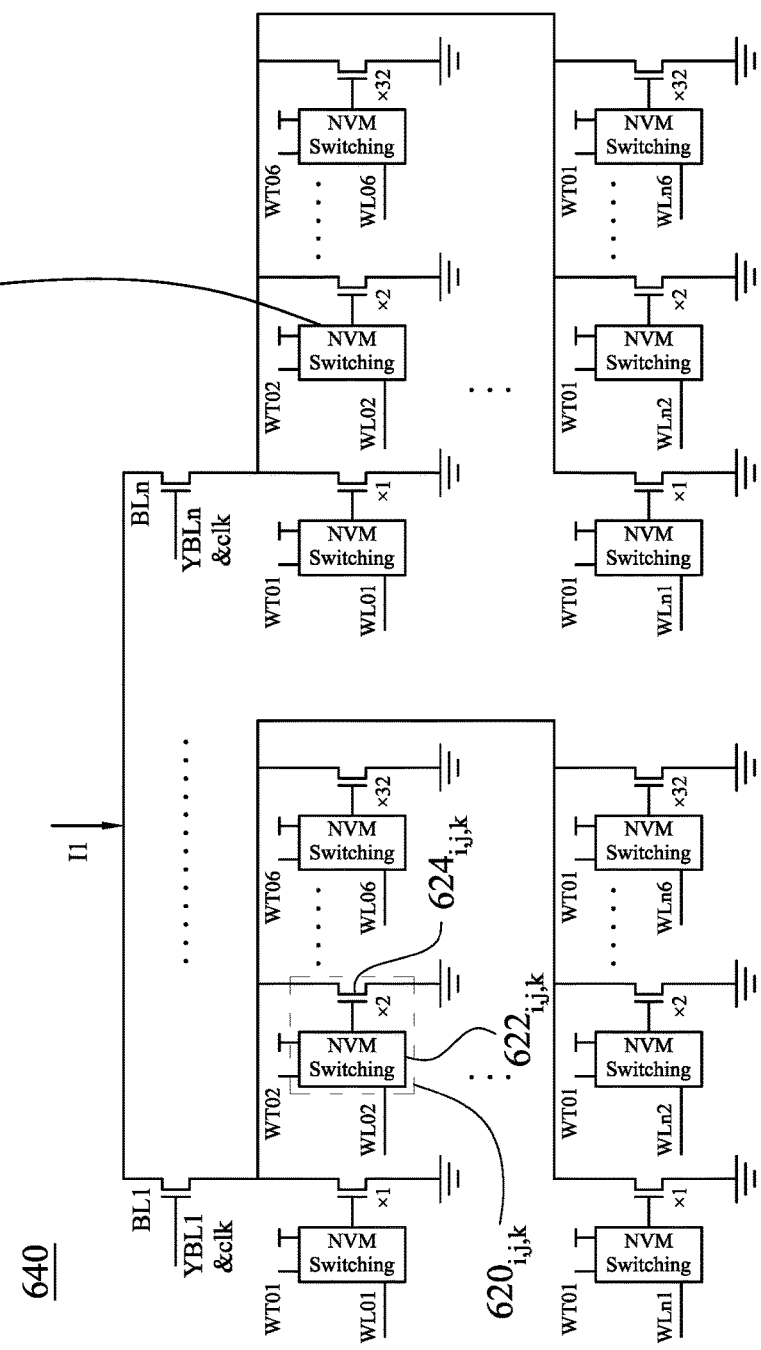

In other embodiments, such as the example shown in FIGS. 6A and 6B, the memory circuit 640 is similar to the circuit 440 described above and shown in FIGS. 4A and 4B, except that the NVM switching circuit 422 is replaced by an SRAM switching circuit 622, which includes a 6T SRAM cell that includes a pair of CMOS inverters 652 and 654 cross-coupled to each other at nodes N and NB, and a pair of access transistors 656 and 658, which enable writing of signals WT and WTB, respectively, from the bitlines (not shown) for the SRAM cell. The SRAM switching circuit 622 further includes a pair of transistors 662 and 664, each controlled by a respective node of the 6T SRAM cell. The gates of transistors 662 and 664 are connected to nodes N and NB, respectively. The sources of transistors 662 and 664 are connected to each other and to the gate of the weighted transistor 624. The drain of transistor 662 is connected to the WL; the drain of transistor 664 is connected to ground. For a "1" stored at node N, and therefore "0" at node NB, transistor 662 is turned on, and transistor 664 off. The output to the weighted transistor 624 thus follows the signal WL. For a "0" stored at node N, and therefore "1" at node NB, transistor 662 is turned off, and transistor 664 on. The output to the weighted transistor 624 is thus "0" regardless of the signal WL. The output to the weighted transistor 624 is thus given by the binary product of the value at node N and the value at WL. Each cell 620 therefore generates a current in the weighted transistor 624 that is proportional to the product between the weight stored in the SRAM cell 622 and the value at WL, and that current is a part of the total current in the respective $BL_1$, $BL_2$, or $BL_m$ (see, also, FIGS. 2, 3, 4 and 5).

Figure 7:
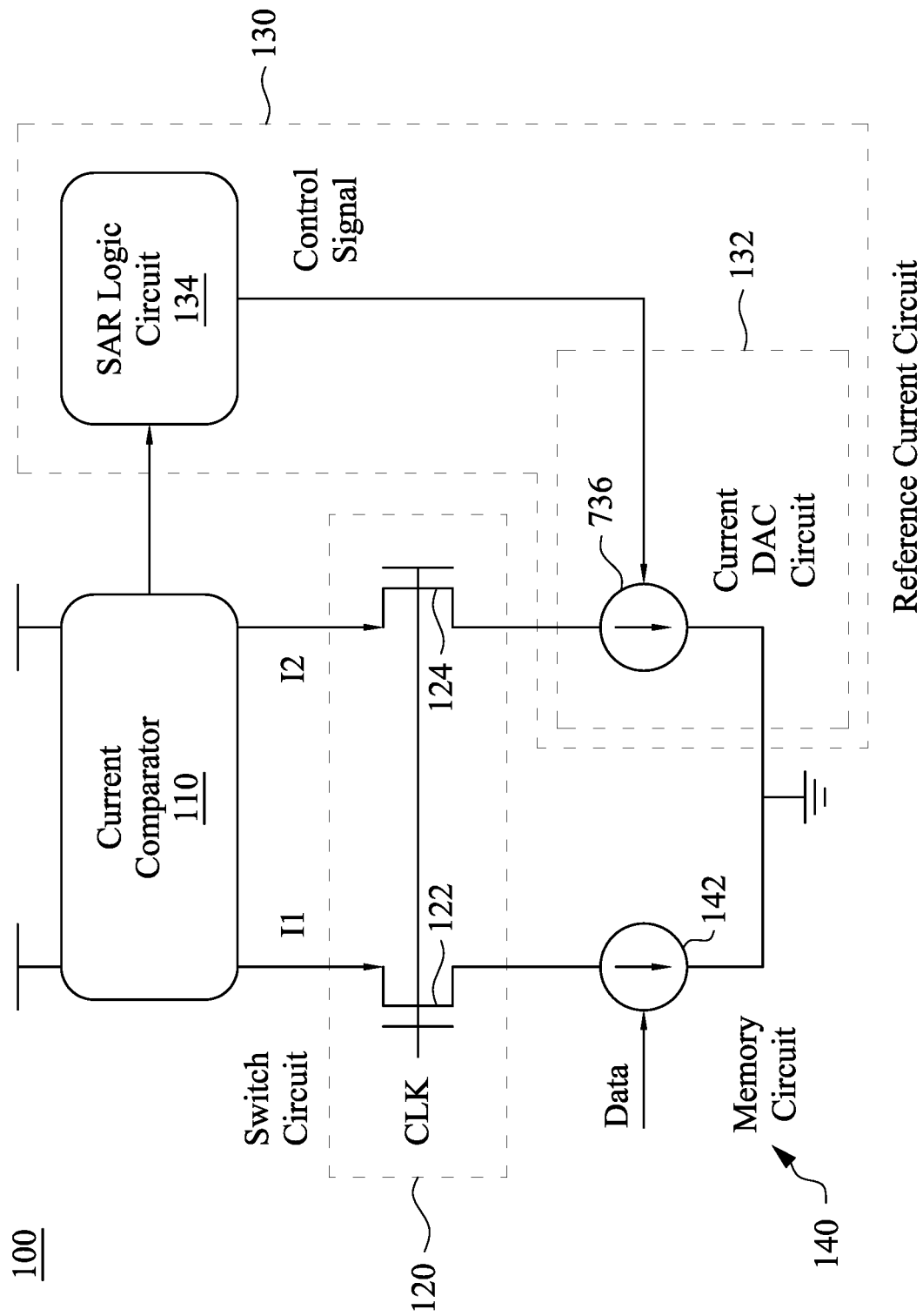
FIG. 7 shows a block diagram illustrating an example of a memory system of FIG. 1, having a current digital-to-analogue converter ("DAC") circuit, in accordance with some embodiments.
Figure 9:
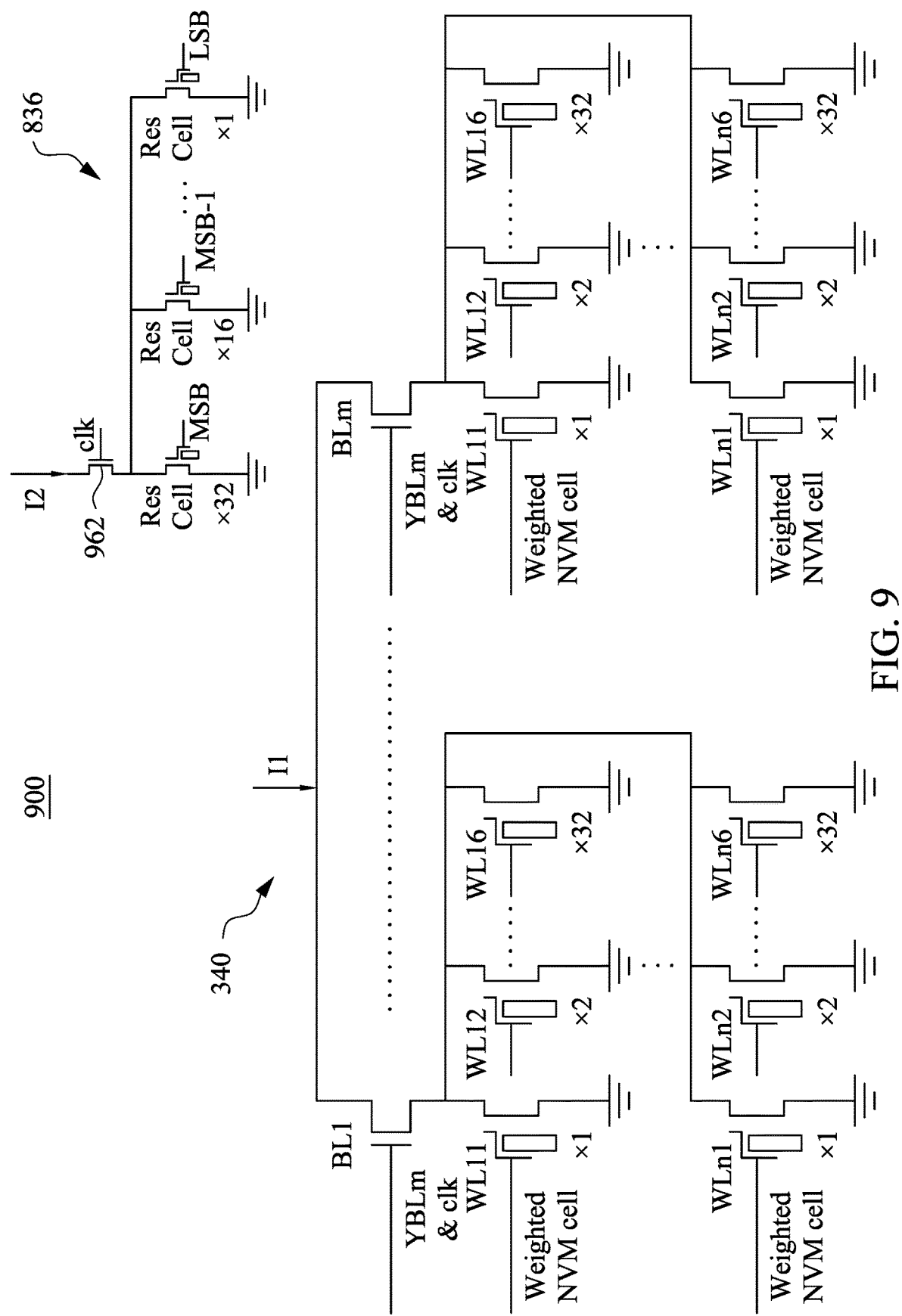
FIG. 9 schematically shows a combination of specific implementations of the memory circuit and current DAC circuit in a portion of the memory system shown in FIGS. 1 and 7, in accordance with some embodiments.

Turning to example embodiments of the reference current circuit 130, the current DAC circuit 132, as shown in the block diagram in FIG. 7, includes a reference current generator 736, which generates an analog current signal based on the digital control signal from the logic circuit 134 as explained in the examples below in connection with FIGS. 8A-C and 9. In some embodiments, as shown in FIG. 8A, the reference current generator 736 is implemented with a set of current sources $838_1$, $838_2$, ..., $838_k$, ..., $838_n$, which can be implemented as explained in more detail below in connection with FIGS. 8B and 8C, connected to each other in parallel, each controlled by a respective binary signal C1, C2, ..., Ck, ..., Cn. In some embodiments, the number of current sources 838 corresponds to (e.g., the same as) the number of bits in the input data.

More specifically, in some embodiments, as shown in FIG. 8B, each current source $838_k$ is implemented with a reference NVM cell $848_k$. Furthermore, in some embodiments the sizes of the reference NVM cells 848 are binary weighted, as explained above regarding the NVM cells and weighted transistors in the memory current circuits.

In some embodiments the reference NVM cell 848 are multi-level NVM cells. In some embodiments, each reference NVM cell 848 has current levels corresponding to the current levels in the memory current circuit the total current of which the reference current circuit 836 is to match. For example, if each NVM cell in the circuit in FIG. 3 has four current levels, the reference NVM cells 848 each has four levels as well in some embodiments. Furthermore, in some embodiments, the current levels for the reference NVM cells 848 substantially match the current levels of the NVM cells in the memory current circuit. In some embodiments, where the current of the NVM cells in the memory current circuit are set at levels of equal intervals, and the current for the reference NVM cells 848 are also set at levels of equal intervals. In other embodiments, where the current levels of the NVM cells in the memory current circuit are set at levels of equal intervals, and the current levels for the reference NVM cells 848 are spaced such that each reference current interval between two closest reference current interval levels contains an NVM cell current level, such that each NVM cell current level can be uniquely bracketed by a lower and upper bounds. That is, for each current level in the memory current circuit, there are two neighboring current levels for the reference current circuit, such that each current level in the memory current circuit can be determined to be between within a smallest current interval for the reference current circuit.

In some embodiments, such as the example shown in FIG. 8C, the reference current generator 836 is implemented with a thermometer DAC, in which the current sources 858 are identical to each other, i.e., generating the same current levels in response to the same control signals. The input of a thermometer DAC is a thermometer-coded digital signal, which represents a number n with a sequence of "1"s of sequence length n, i.e., represents an integer n with n consecutive "1"s. For example, 0000000 is a 7-bit thermometer code for decimal 0, 0001111 for decimal 4, 1111111 for 7; and so on. For example, the current sources 858 can be multi-level reference NVM cells similar to those in FIG. 8B but with identical sizes to each other.

Various combinations of the memory current circuits and reference current circuits can be used in a CIM system. For example, the CIM system 100 can be implemented with a CIM system 900, shown in FIG. 9. The system includes a memory current circuit 340 of FIG. 3 and a reference current circuit 836 of FIG. 8B (with a clock-gated transistor 962 added). A memory current I1 is generated by the memory current circuit 340, and a reference current I2 is generated by the reference current circuit 836. I1 and I2 can be compared by the current comparator 110, which outputs a comparison signal to the SAR logic circuit 134, which adjusts the current output of the current DAC circuit 132 based on the comparison signal received, as discussed above.

In current comparison operation, according to some embodiments, the logic circuit 134 in FIG. 1 processes the comparison result received from the comparator 110 and then adjusts the control signal to find digital control signal that produces a reference current I2 that matches, as closely as possible, the memory current I1. The match algorithm can be any type of digital searching. For example, in an SAR type matching algorithm, the logic circuit 134 is programmed to set I2 with the most significant bit ("MSB") of the digital control signal on and rest of the bits off, and compared with I1. If I1 is greater than I2, the next MSB of the digital control signal is also turned on, and I2 is again compared with I1; if I1 is smaller than I2, the MSB is turned off and next MSB of the digital control signal is turned on, and I2 is again compared with I1. The process is repeated with progressively less significant bits in the digital control signal until the least significant bit ("LSB") is reached. The digital control signal is then taken as the digital representation of I1, or the product of a multi-bit input and multi-bit weight.

In other embodiments, a thermometer DAC of the type shown in FIG. 8C, in which each current source $858_k$ produces identical current, is used. The logic circuit 134 can be programmed to begin with a single current source, reference cell1 $858_1$, turned on and I2 and I1 compared. If I1 is greater than I2, an additional current source, reference cell2 $858_2$ is also turned on. The process is repeated until I1 is equal to I2. The number of the reference cells turned on is then taken as the digital representation of I1, or the product of a multi-bit input and multi-bit weight.

Figure 10A:
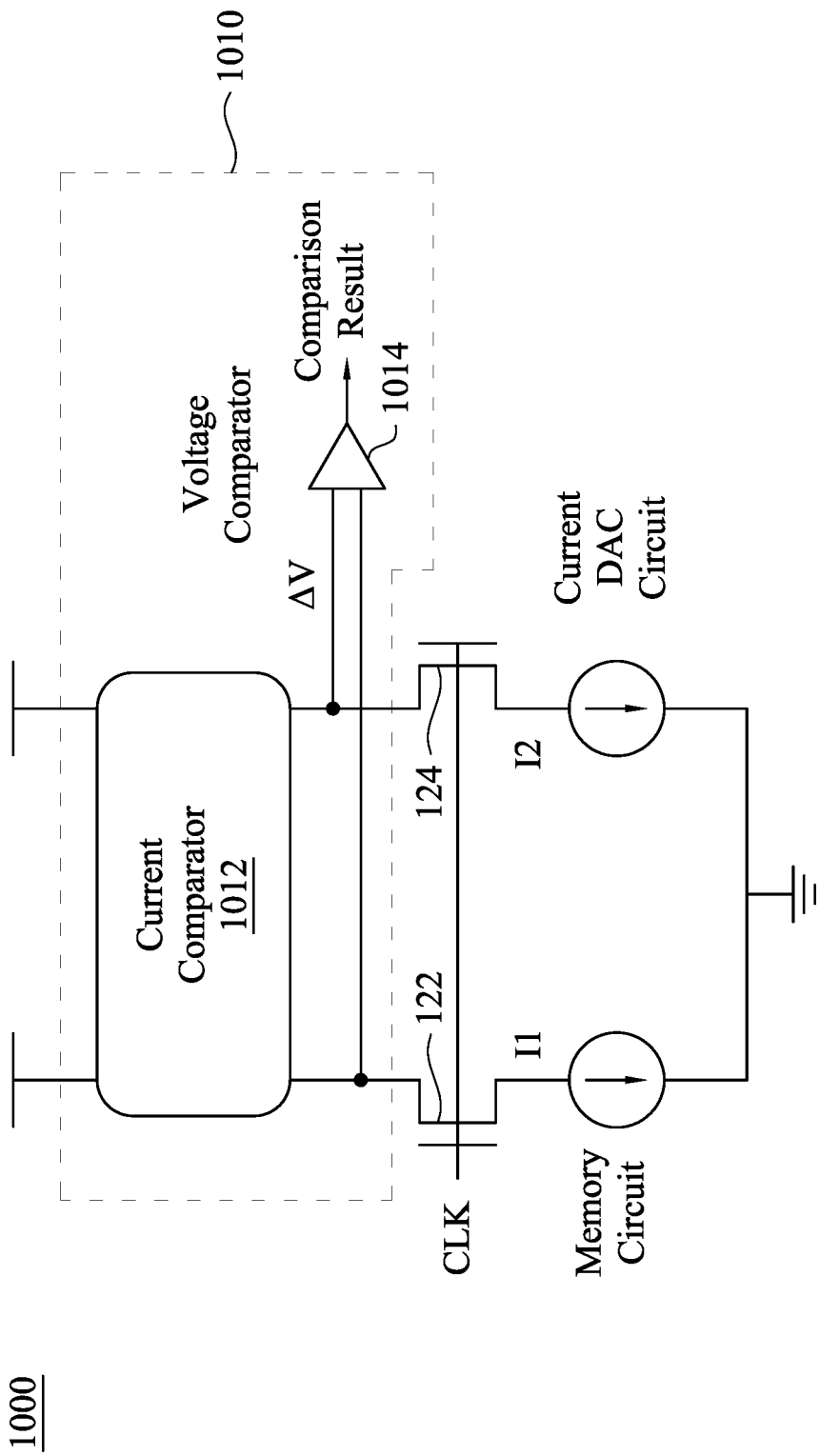
FIG. 10A shows a block diagram of a memory system of the kind shown in FIG. 1, with the current comparator implemented with a loading circuit and voltage comparator, in accordance with some embodiments.

Turning to another aspect of the CIM system 100, the current comparator 110 in FIG. 1 can be of a variety of suitable structures. In some embodiments, such as the example shown in FIG. 10A, the current comparator 110 is implemented by a current comparator 1010, includes a loading circuit 1012 connected to the drains of the clock-gated transistors 122 and 124, and a voltage comparator 1014, the input terminal of which is also connected to the drains of the clock-gated transistors 122 and 124. The loading circuit 1012 generates from I1 and I2 a differential voltage, ΔV, at the drains of the clock-gated transistors 122 and 124. The voltage comparator 1014 then generates an output signal indicative of the result of the comparison, i.e., the polarity (sign) of ΔV, which is indicative of the relative current levels between I1 and I2.

Figure 10B:
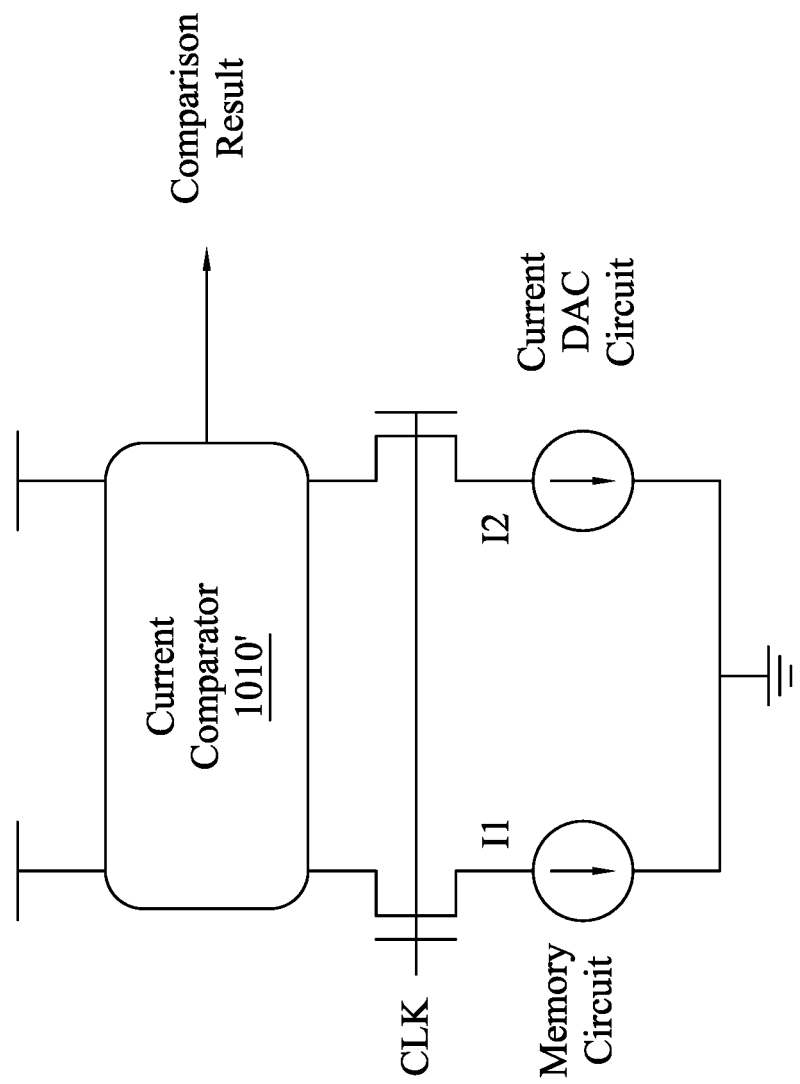
FIG. 10B shows a block diagram of a memory system of the kind shown in FIG. 1, with the current comparator directly comparing the currents in the memory circuit and the current DAC circuit, in accordance with some embodiments.

In some embodiments, such as the example shown in FIG. 10B, the current comparator 110 (in FIG. 1) is implemented by a current comparator 1010', which generates an output signal indicative of the relative current levels between I1 and I2 without first generating a differential voltage signal.

Figure 11A:
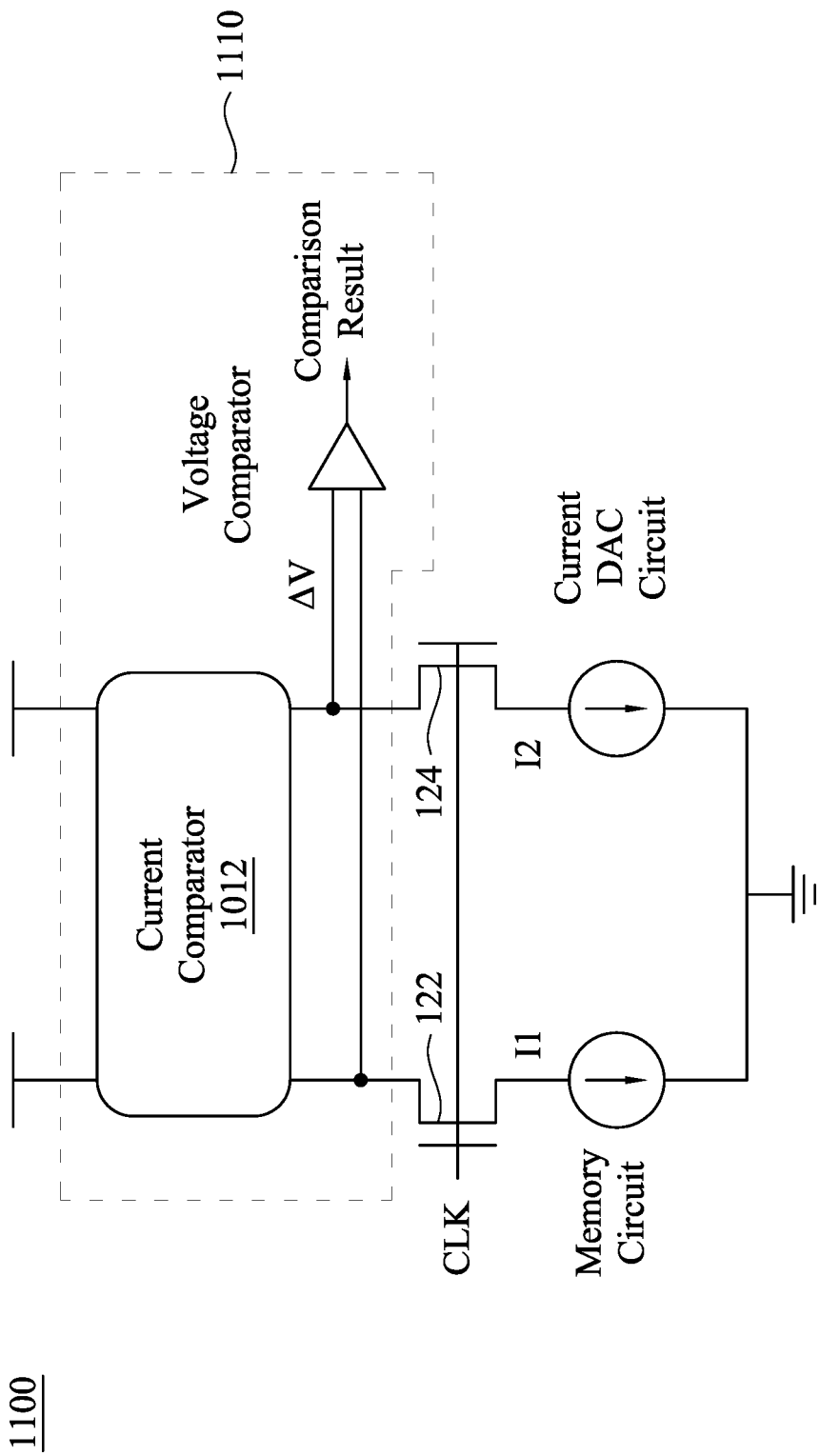
FIGS. 11A-D show the memory system of the kind shown in FIG. 10A, with specific implementations of the loading circuit shown in FIG. 10A, in accordance with some embodiments.
Figure 11B:
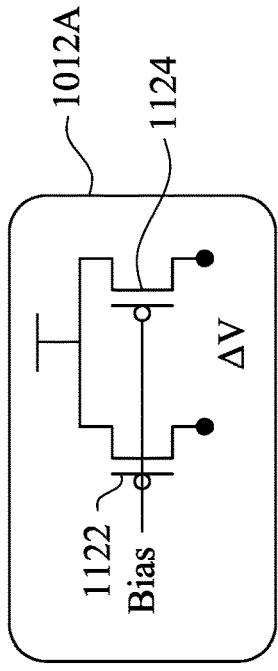
Figure 11D:
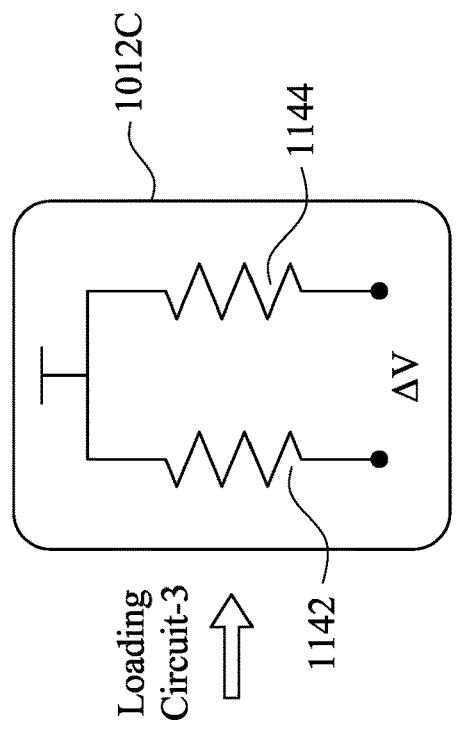
Figure 11C:
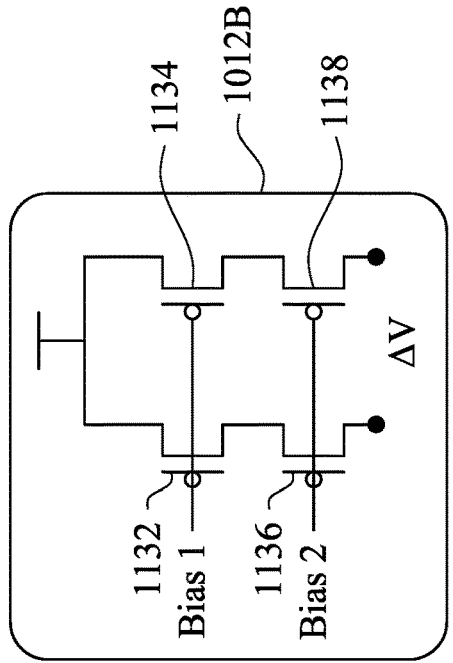

In some embodiments, such as those shown in FIGS. 11A-D, the loading circuit 1012 (in FIG. 10A) in a CIM system 1100 can be implemented in a variety of ways. For example, as shown in FIG. 11B, a loading circuit 1012A includes two actively biased transistors 1122 and 1124. In this example, given the same bias on the gates of both transistors, different currents I1 and I2 results in different drain-source voltages. As the drains of both transistors 1122 and 1124 are connected to a common voltage supply, the source voltages are different, resulting in a differential voltage, ΔV. As another example, shown in FIG. 11C, each of the single transistors 1122 and 1124 in FIG. 11B is replaced by cascade transistor pair, i.e., transistor 1122 by transistors 1132 and 1136, and transistor 1124 by transistors 1134 and 1138. The gates of the transistors 1132 and 1134 are subjected to a first bias; the gates of the transistors 1136 and 1138 are subjected to a second bias. Similar to the loading circuit 1012A, different currents I1 and I2 results in different drain-source voltages. As the drains of both transistors 1132 and 1134 are connected to a common voltage supply, the source voltages of transistors 1136 and 1138 are different, resulting in a differential voltage, ΔV. Due to the cascading configuration, a greater differential voltage, ΔV, can be produced based on the same current difference. In a further example, shown in FIG. 11D, a loading circuit 1012C includes two identical resistors 1142 and 1144. Different I1 and I2 results in a differential voltage, ΔV, by the virtue of Ohm's law.

Figure 12B:
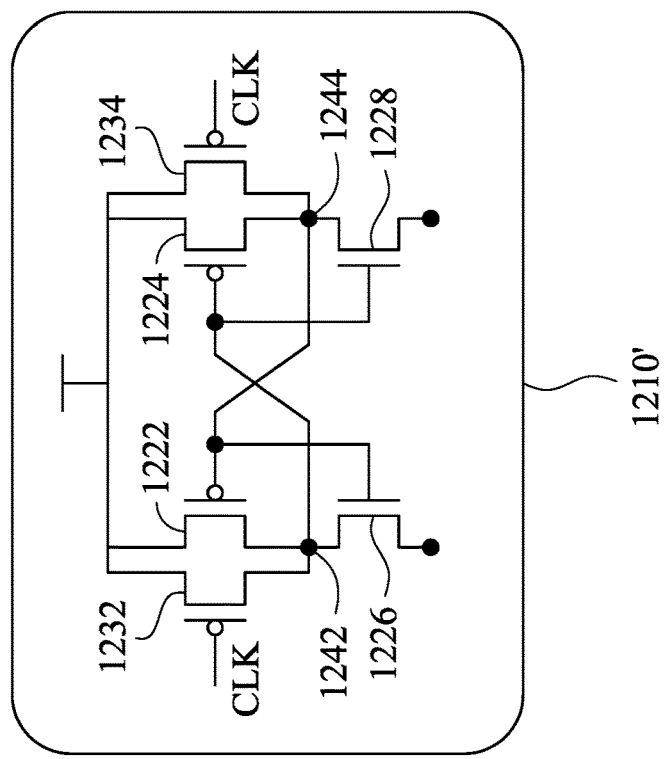
FIGS. 12A and 12B show the memory system of the kind shown in Figure with specific implementations of the current comparator shown in FIG. 10A, in accordance with some embodiments.
Figure 12A:
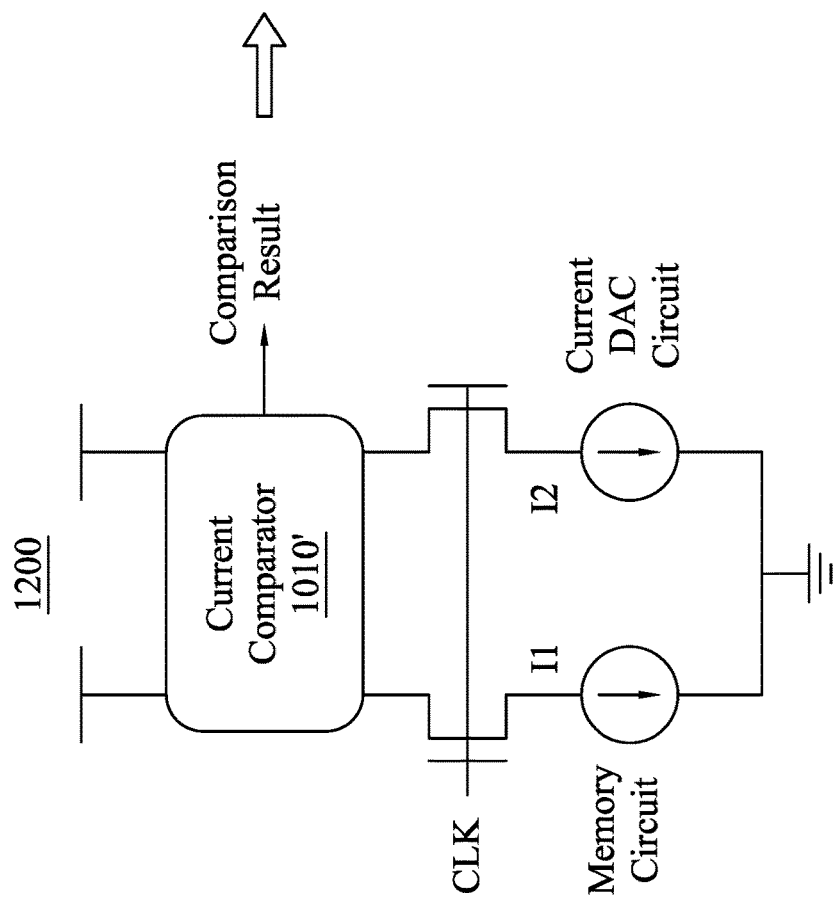

In some embodiments, such as the example shown in FIGS. 12A and 12B, a current comparator 1010' (in FIG. 10B) that outputs a signal indicative of the result of comparison without using a differential voltage includes a latch circuit, which include PMOS transistors 1222 and 1224, and NMOS transistors 1226 and 1228. The current comparator 1010' further includes a pair of clock-controlled PMOS transistors 1232 and 1234 for resetting the comparator 1010'. After the comparator 1010' is reset by a clock pulse CLK, a higher I1 than I2 would cause the voltage at the node 1242 to be lower than the voltage at the node 1244. Due to the positive feedback of the latch circuit, the voltage at the node 1242 will continue to fall while the voltage at the node 1244 will continue to rise. As a result, the output voltage at the node 1244 rapidly becomes the rail voltage $V_{DD}$ if I1>I2, or ground if I1<I2. The output voltage at the node 1244 (or 1242) is thus a 1 or 0 and can then be used as the input to the logic circuit 134.

Figure 13:
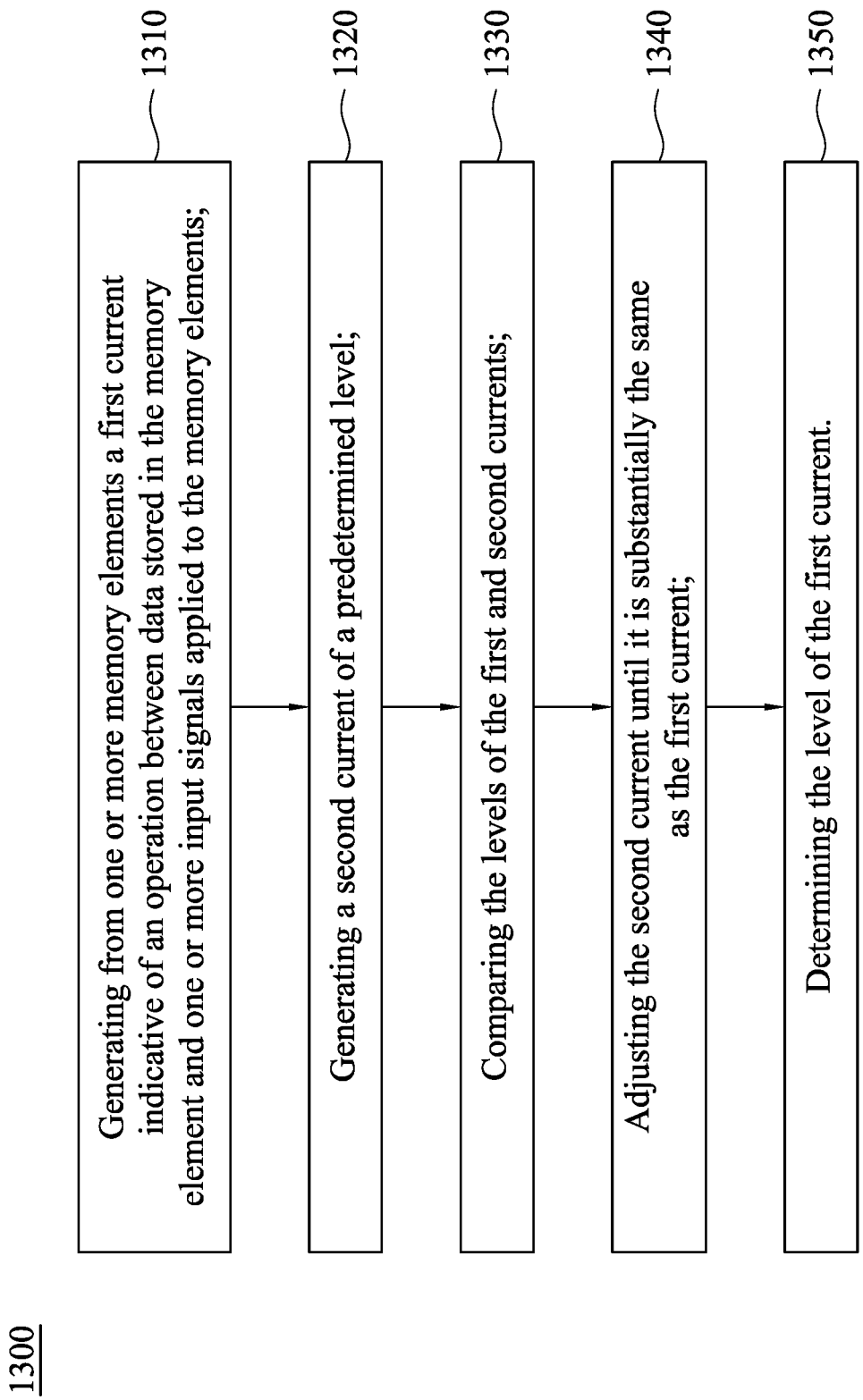
FIG. 13 is a flow chart outlining a method of computing in accordance with some embodiments.

Thus, according to a more general aspect of the present disclosure, as outlined in FIG. 13, a method 1300 of computing includes generating 1310, e.g., with the memory current circuit 240, 340, 440, 540 or 640, from one or more memory elements a first current indicative of an operation (e.g., multiplication) between data stored in the memory element and one or more input signals applied to the memory elements. The method 1300 also includes generating 1320, e.g., with the reference current circuit 836 or 936, a second current of a predetermined level. The method 1300 further includes comparing 1330, e.g., with the current comparator 1010, 1010', 1110, or 1210', the levels of the first and second currents. The method 1300 additionally include adjusting 1340, e.g., with the logic circuit the second current until it is substantially the same as the first current. Moreover, the method 1300 includes determining 1350 the level of the first current, e.g., by determining the level of the first current to be the level of the second current and the end of the adjustment step 1340.

The use of current comparison in the example CIM systems disclosed above enables high speed (GHz clock rates) CIM operations such as MAC operations as compared to voltage-based CIM operations due to the need for current integration to produce voltage. The elimination of clamping circuit typically used in voltage-based CIM systems results in reduced manufacturing cost while maintaining even current. Furthermore, the use of clock-gated transistors avoids or reduces static current flow, thereby reducing the power consumption.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A computing system, comprising:
a memory circuit comprising an input adapted to receive a first set of data and a plurality of memory elements, each adapted to store a respective one of a second set of data and receive a respective one of the first set of data, the memory circuit being adapted to generate a memory current of a level indicative of a sum of products between the data stored in the plurality of memory elements and respective input signals;
a reference current circuit adapted to generate a reference current of predetermined levels; and
a current comparator adapted to receive the memory current and the reference current and generate a signal indicative of a difference between the levels of the memory current and the reference current;
the reference current circuit further adapted to receive the signal generated by the current comparator and adjust the reference current to another predetermined level based on the received signal.

2. The computing system of claim 1, wherein the reference current circuit comprises:
a current control circuit adapted to receive the signal generated by the current comparator and generate a current control signal corresponding to the received signal generated by the current comparator; and
a current generator adapted to receive the current control signal and adjust the reference current to another predetermined level based on the current control signal.

3. The computing system of claim 2, wherein the current control circuit is adapted to generate a digital current control signal corresponding to the received signal generated by the current comparator.

4. The computing system of claim 2, wherein the current control circuit comprises a digital-to-analog converter ("DAC") adapted to generate the reference current based on the digital current control signal received from the current control circuit.

5. The computing system of claim 2, wherein the current control circuit comprises a plurality of current sources, each of which being adapted to receive a bit of the digital current control signal and generate a current depending on the state of the received bit.

6. The computing system of claim 5, wherein each of the plurality of current sources comprises a memory element adapted to store data, receive a respective bit of the digital current control signal and generate a current at a level depending on the received bit and the stored data.

7. The computing system of claim 6, wherein each of the plurality of memory elements comprises a multi-level non-volatile memory ("NVM") cell.

8. The computing system of claim 5, wherein the plurality of current sources substantially identical to each other, and wherein the current control circuit is adapted to generate a thermometer coded digital current control signal.

9. The computing system of claim 1, each of the memory elements having a characteristic size, the characteristic sizes of the plurality of memory elements being binary-weighted.

10. The computing system of claim 1, wherein the current comparator comprises a loading circuit adapted to generate the differential voltage having a polarity depending on the relative levels of the memory current and reference current, and a voltage comparator adapted to receive the differential voltage and generate an out indicative of the polarity of the differential voltage.

11. The computing system of claim 1, wherein each of the plurality of memory elements comprises a non-volatile volatile memory ("NVM") switch circuit and a transistor adapted to be turned on and off by the NVM switch circuit and supply a respective portion of the memory current to the current comparator, wherein the plurality of memory elements are connected to a common reference voltage.

12. A computing device, comprising:
a plurality of memory elements arranged logically in rows and columns, each of the memory elements including a control terminal and a pair of current-carrying terminals and being adapted to store a weight value and generate through the current-carrying electrodes a current indicative of a product of a signal received at the control terminal and the weight value;
a current comparator;
a plurality of switch devices, each coupling a column of the memory elements and the current comparator; and
a reference current circuit adapted to generate a reference current of predetermined levels;
the current comparator being connected to the reference current circuit and adapted to receive the reference current and the currents generated by memory elements of the memory circuit, to compare the reference current level to a sum of the currents generated by memory elements of the memory circuit, and to generate an output signal indicative of the result of the comparison, the reference current circuit further adapted to receive the output signal generated by the current comparator and adjust the reference current to another predetermined level depending on the signal received from the current comparator.

13. The computing device of claim 12, wherein each of the plurality of memory elements comprises an NVM cell having a binary-weighted characteristic size according to the row in which the NVM cell is located.

14. The computing device of claim 12, wherein the reference current circuit comprises:
   a current control circuit adapted to receive the signal generated by the current comparator and generate a current control signal corresponding to the received signal generated by the current comparator; and
   a current generator adapted to receive the current control signal and adjust the reference current to another predetermined level based on the current control signal.

15. The computing device of claim 12, wherein the current control circuit comprises a logic circuit configured to receive the signal from the current comparator and generate a digital current control signal based on the signal received from the current comparator and according to a successive-approximation algorithm.

16. The computing device of claim 12, wherein the current control circuit comprises a logic circuit configured to receive the signal from the current comparator and generate a thermometer-coded digital current control signal based on the signal received from the current comparator.

17. A method of computing, comprising:
   generating from an array of memory elements and respective input signals applied to the respective memory elements, each adapted to store a respective weight value, a first current indicative of a sum of products between the weight values stored in the respective memory elements and the respective input signals;
   generating a second current of a predetermined level;
   comparing the levels of the first and second currents;
   adjusting the second current until it is substantially the same as the first current; and
   determining the level of the first current.

18. The method of claim 17, where:
   the data stored in the memory elements are indicative of weight values;
   the adjusting the second current comprise generating a digital current control signal based on the comparison of the first and second current and using the digital current control signal to turn on or off one or more of a plurality of current sources each adapted to supply a current of a respective known level; and
   the determining the level of the first current comprises determining that the digital current control signal at which the first and second currents are substantially the same is indicative of the level of the first current.

19. The method of claim 17, wherein each of the plurality of memory elements comprises an NVM cell having a binary-weighted characteristic size according to the row in which the NMV cell is located.

20. The method of claim 17, wherein the adjusting the second current comprises generating a thermometer-coded digital current control signal based on an outcome of the comparing step.

* * * * *